(12) United States Patent
Lai et al.

(10) Patent No.: US 6,808,013 B2
(45) Date of Patent: Oct. 26, 2004

(54) HEAT DISSIPATION DEVICE WITH WORKING LIQUID RECEIVED IN CIRCULATORY ROUTE

(75) Inventors: Cheng-Tien Lai, Tu-Chen (TW); Tsung-Lung Lee, Tu-Chen (TW); Shenghua Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 12 days.

(21) Appl. No.: 10/174,770

(22) Filed: Jun. 18, 2002

(65) Prior Publication Data

US 2003/0173061 A1 Sep. 18, 2003

(30) Foreign Application Priority Data

Mar. 13, 2002 (TW) ...................................... 91202950 U (51) Int. Cl.[7] .............................. F28F 7/00; H05K 7/20
(52) U.S. Cl. ................................ 165/80.4; 165/104.21; 165/104.33; 361/700; 361/702; 361/703
(58) Field of Search ............................. 165/80.1, 80.2, 165/80.3, 80.4, 185, 104.21, 104.33; 361/700, 702, 703

(56) References Cited

U.S. PATENT DOCUMENTS

| | | | | |
|---|---|---|---|---|
| 1,808,617 A | * | 6/1931 | Thompson | 165/80.4 X |
| 2,992,372 A | * | 7/1961 | Himeon et al. | 165/80.3 |
| 3,669,812 A | * | 6/1972 | Ensslin | 165/80.4 X |
| 3,768,548 A | * | 10/1973 | Dilay et al. | 165/80.4 X |
| 4,079,410 A | * | 3/1978 | Schierz | 165/80.4 X |
| 4,268,850 A | * | 5/1981 | Lazarek et al. | 165/80.4 X |
| 4,562,512 A | * | 12/1985 | Sutrina | 165/80.4 X |
| 4,724,901 A | * | 2/1988 | Munekawa | 165/104.21 |
| 4,733,331 A | * | 3/1988 | Chauvet | 165/80.4 X |
| 4,931,905 A | * | 6/1990 | Cirrito et al. | 165/80.4 X |
| 5,091,824 A | * | 2/1992 | Dzwonczyk | 165/80.4 X |
| 5,285,347 A | * | 2/1994 | Fox et al. | 165/80.3 X |
| 5,329,993 A | * | 7/1994 | Ettehadieh | 165/80.4 X |
| 5,647,430 A | * | 7/1997 | Tajima | 165/104.33 |
| 5,829,516 A | * | 11/1998 | Lavochkin | 165/80.4 |
| 5,901,037 A | * | 5/1999 | Hamiilton et al. | 165/80.4 X |
| 5,940,270 A | * | 8/1999 | Puckett | 165/80.4 X |
| 6,053,238 A | * | 4/2000 | Goth et al. | 165/80.4 X |
| 6,109,337 A | * | 8/2000 | Gomez | 165/104.33 X |
| 6,137,682 A | * | 10/2000 | Ishimine et al. | 165/104.33 X |
| 6,152,213 A | * | 11/2000 | Suzuki et al. | 165/80.4 X |
| 6,252,771 B1 | * | 6/2001 | Jordan | 165/80.4 X |
| 6,263,957 B1 | * | 7/2001 | Chen et al. | 165/80.4 |
| 6,394,175 B1 | * | 5/2002 | Chen et al. | 165/80.3 |
| 6,397,936 B1 | * | 6/2002 | Crowley et al. | 165/80.4 X |
| 6,591,898 B1 | * | 7/2003 | Chu et al. | 165/104.33 X |
| 6,600,649 B1 | * | 7/2003 | Tsai et al. | 165/104.33 X |

* cited by examiner

Primary Examiner—Ljiljana Ciric
(74) Attorney, Agent, or Firm—Wei Te Chung (57) ABSTRACT

A heat dissipation device (1) includes a heat sink (12), a number of first pipes (14), a pair of second pipes (16), and working liquid. The heat sink includes a base (122), and a number of fins (124) attached on the base. A number of parallel first holes (126) is defined through the base. A second hole (128) is defined through a middle of the base in a longitudinal direction that is perpendicular to the first holes. The first and second pipes and the first and second holes thus cooperatively form a closed circulatory route. The working liquid is received in the circulatory route. In operations the working liquid absorbs heat at the base and circulates through the circulatory route. The first and second pipes dissipate said heat to airspace beyond the fins. Accordingly, the first and second pipes increase a heat dissipation area of the heat dissipation device.

10 Claims, 10 Drawing Sheets

HEAT DISSIPATION DEVICE WITH WORKING LIQUID RECEIVED IN CIRCULATORY ROUTE

BACKGROUND OF THE INVENTION

1. Field of the Invention

The present invention relates to a heat dissipation device, and more particularly to a heat dissipation device which has a plurality of heat pipes surrounding a heat sink to form a closed circulation route.

2. Description of Prior Art

During operation of many heat generating devices such as central processing units (CPUs), large amounts of heat are produced. Such heat must be quickly removed from the heat generating device, to prevent it from becoming unstable or being damaged. Typically, a heat dissipation device is attached to an outer surface of a heat generating device to remove heat therefrom.

Figure 14:
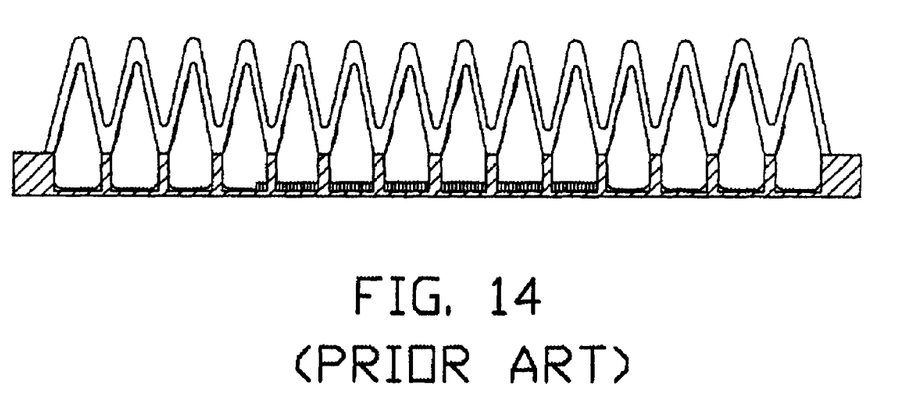
FIG. 14 is a schematic cross-sectional side plan view of a conventional heat dissipation device.

Referring to FIG. 14, a conventional heat dissipation device comprises a hollow chassis, working liquid received in the chassis, and a plurality of fins extending upwardly from the chassis. In operation, the chassis conductively absorbs heat from a heat generating device. The working liquid absorbs such heat, and then transfers the heat to the fins by phase transition, convection and circulation. However, convection of the working liquid within the chassis is often poor. As a result, the heat dissipation device cannot adequately dissipate heat from the heat generating device.

Figure 15:
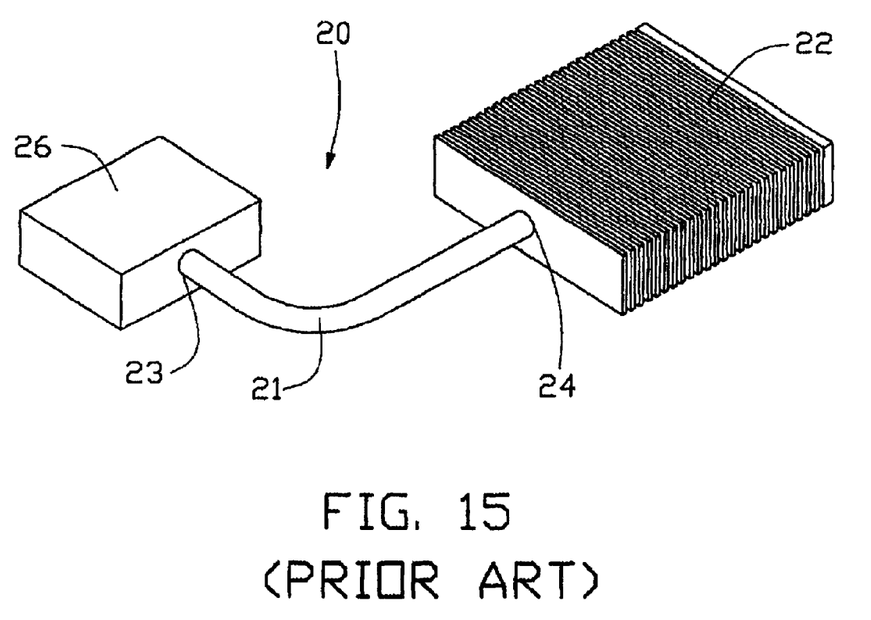
FIG. 15 is a perspective view of another conventional heat dissipation device.

Referring to FIG. 15, another conventional heat dissipation device 20 comprises a metal block 26, a heat pipe 21 and a plurality of parallel fins 22. The metal block 26 is directly mounted on an outer surface of a heat generating device (not shown). One end of the heat pipe 21 is engaged in an aperture 23 of the metal block 26, and an opposite end of the heat pipe 21 is extended through apertures 24 of the fins 22 to be in intimate thermal contact with the fins 22. However, the thermal contact surface of the both ends of the heat pipe is limited. Accordingly, the heat removal capability of the heat dissipation device is frequently not sufficient.

Thus, an improved heat dissipation device which overcomes the above-mentioned problems is strongly desired.

SUMMARY OF THE INVENTION

Accordingly, an object of the present invention is to provide a heat dissipation device which has a plurality of heat pipes surrounding a heat sink to attain great heat removal capability.

Another object of the present invention is to provide a heat dissipation device having simple and compact structure.

In order to achieve the objects set out above, a heat dissipation device in accordance with a preferred embodiment of the present invention comprises a heat sink, a plurality of first pipes, a pair of second pipes and working liquid. The heat sink comprises a base, and a plurality of fins attached on the base. A plurality of parallel first holes is defined through the base. A second hole is defined through a middle of the base in a longitudinal direction that is perpendicular to the first holes. The first and second pipes and the first and second holes thus cooperatively form a closed circulatory route. The working liquid is received in the circulatory route. In operation, the base absorbs heat from a heat generating electronic device. The working liquid absorbs some of that heat, and circulates through the circulatory route. Thus the first and second pipes dissipate said heat to airspace beyond the fins of the heat sink. Accordingly, the first and second pipes increase a heat dissipation area of the heat dissipation device. The heat removing capability of the heat dissipation device is optimized.

Other objects, advantages and novel features of the present invention will become more apparent from the following detailed description when taken in conjunction with the accompanying drawings, in which:

DETAILED DESCRIPTION OF THE INVENTION

Reference will now be made to the drawing figures to describe several embodiments of the present invention in detail.

FIGS. 1–4 relate to a heat dissipation device 1 in accordance with a preferred embodiment of the present invention. The heat dissipation device 1 comprises a heat sink 12, a plurality of first pipes 14, a pair of second pipes 16, and working liquid (not shown). The heat sink 12 comprises a rectangular base 122, and a plurality of parallel vertical fins 124 attached on the base 122. The base 122 is adapted to be mounted on a heat generating electronic device (not shown). A plurality of evenly spaced and parallel first holes 126 is defined through the base 122. Each first hole 126 spans opposite lateral sides of the base 122, and is oriented perpendicular to the fins 124. A second hole 128 is defined through a middle of the base 122, in a longitudinal direction that is parallel to the fins 124. The second hole 128 is defined at a lower level than the first holes 126, so that the first and second holes 126, 128 do not communicate with each other.

Figure 1:
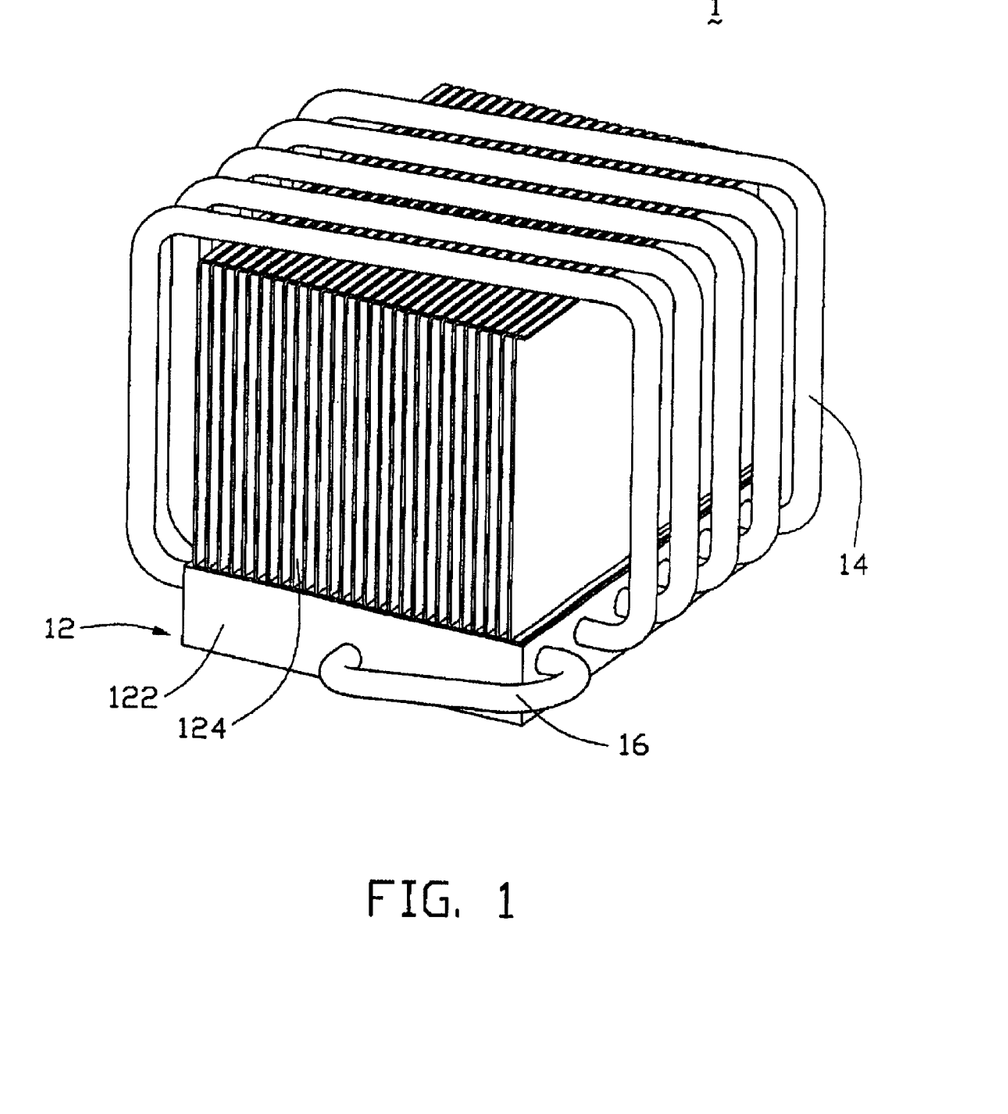
FIG. 1 is a perspective view of a heat dissipation device in accordance with a preferred embodiment of the present invention.
Figure 2:
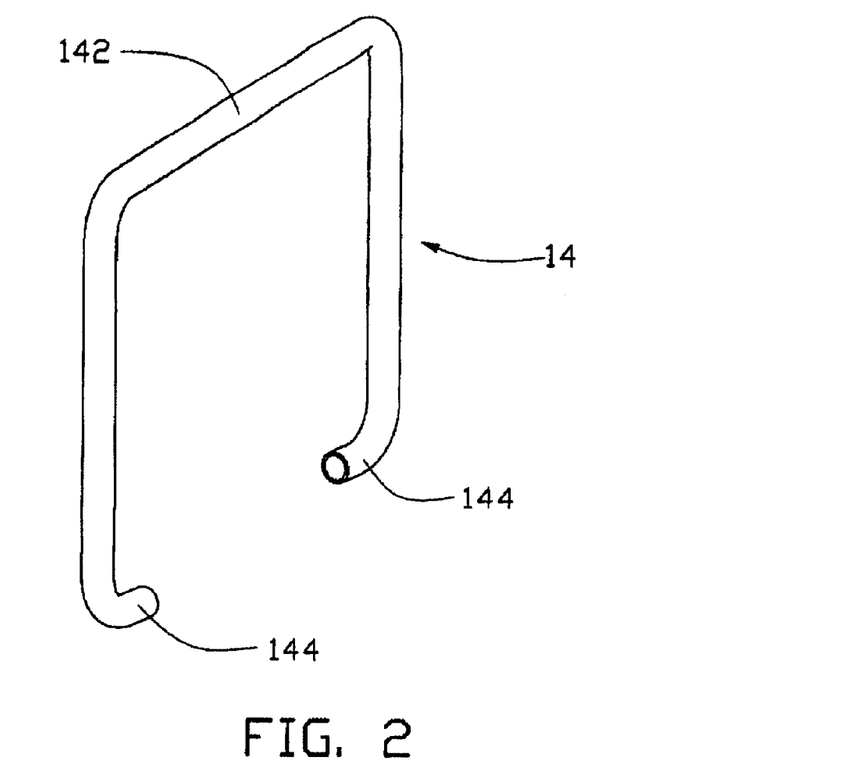
FIG. 2 is a perspective view of a first pipe of the heat dissipation device of FIG. 1, viewed from another aspect.
Figure 3:
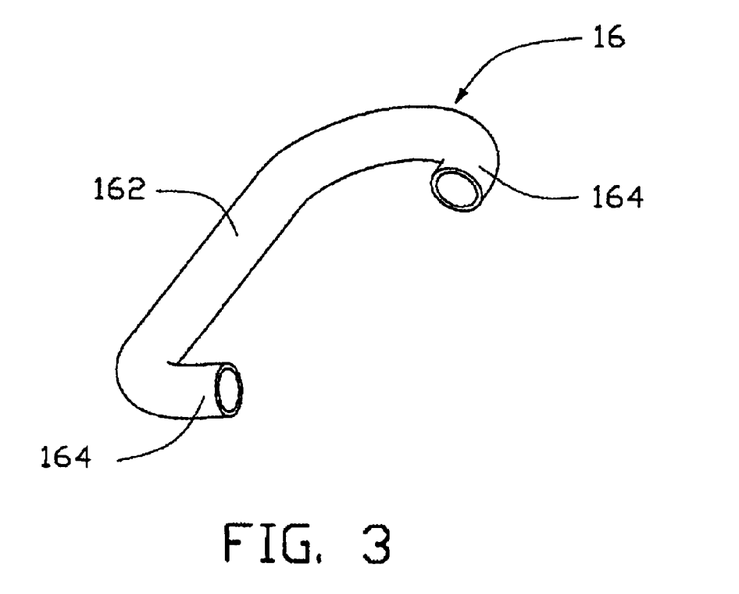
FIG. 3 is a perspective view of a second pipe of the heat dissipation device of FIG. 1, viewed from another aspect.
Figure 4:
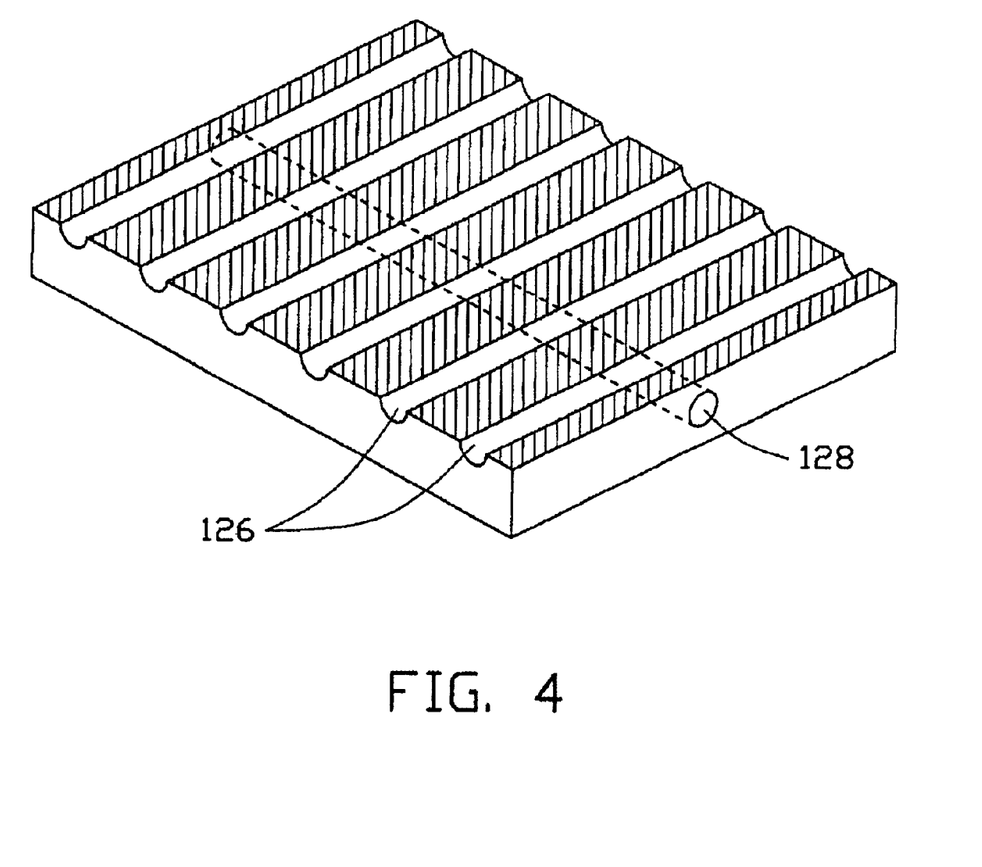
FIG. 4 is a perspective cut-away view of a base of a heat sink of the heat dissipation device of FIG. 1, viewed from another aspect.
Figure 5:
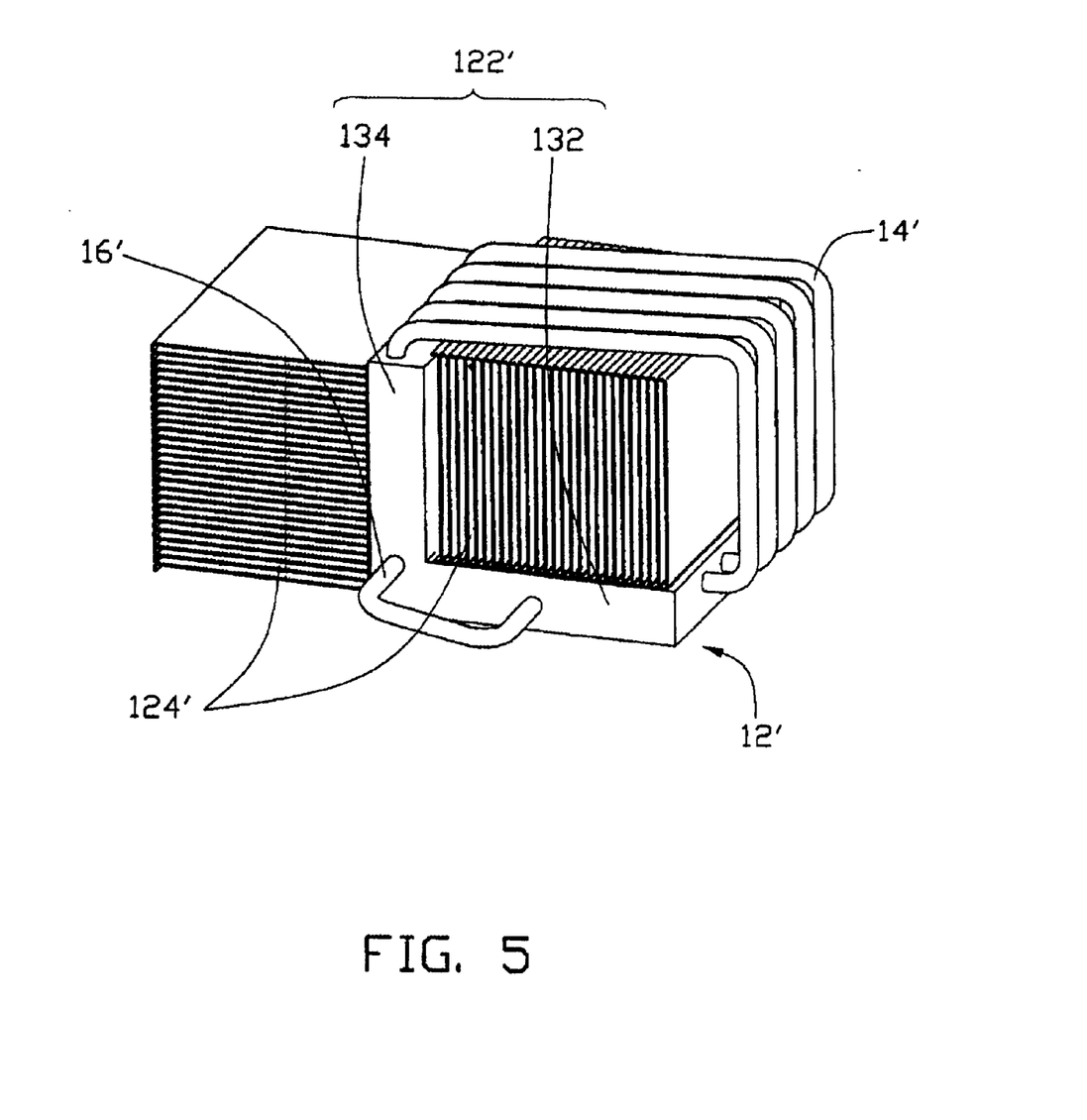
FIG. 5 is a perspective view of a heat dissipation device in accordance with an alternative embodiment of the present invention.

Referring particularly to FIGS. 2 and 3, the first and second pipes 14, 16 are hollow and have good heat conducting capability. Each first pipe 14 comprises a U-shaped main body 142, and a pair of connecting portions 144 bent inwardly generally toward each other from opposite free ends of the main body 142 respectively. The connecting portions 144 are bent inwardly in an asymmetrical fashion so that they can be easily connected into the appropriate first holes 126 of the heat sink 12. Each second pipe 16 comprises a generally arcuate main body 162, and a pair of connecting portions 164 bent inwardly from opposite free ends of the main body 162 respectively.

In assembly, the connecting portions 144 of the first pipes 14 are connected in the first holes 126 of the heat sink 12 such that each first pipe 14 crosses over from one first hole 126 at one lateral side of the base 122 of the heat sink 12 to an adjacent first hole 126 at an opposite lateral side of the base 122. One of the second pipes 16 is connected around a corner of the base 122 of the heat sink 12. The connecting portion 164 at one end of said second pipe 16 is connected in the second hole 128 at one end of the base 122. The connecting portion 164 at an opposite end of said second pipe 16 is connected in a nearest first hole 126 at one lateral side of the base 122. The other of the second pipes 16 is connected around a diagonally opposite corner of the base 122. The connecting portion 164 at one end of said second pipe 16 is connected in the second hole 128 at an opposite end of the base 122. The connecting portion 164 at an opposite end of said second pipe 16 is connected in a nearest first hole 126 at an opposite lateral side of the base 122. The first and second pipes 14, 16, and the first and second holes 126, 128 thus cooperatively form a closed circulatory route. The working liquid is received in the circulatory route. In operation, the base 122 absorbs heat from the heat generating electronic device. The working liquid absorbs some of that heat, and circulates through the circulatory route. Thus the first and second pipes 14, 16 dissipate said heat to airspace beyond the fins 124 of the heat sink 12. Accordingly, the first and second pipes 14, 16 increase a heat dissipation area of the heat dissipation device 1. The heat removing capability of the heat dissipation device 1 is optimized.

FIGS. 5–8 relate to a heat dissipation device 2 in accordance with an alternative embodiment of the present invention. The heat dissipation device 2 comprises a heat sink 12', a plurality of first pipes 14', a pair of second pipes 16', and working liquid (not shown). The heat sink 12' comprises a base 122' having an L-shaped profile, and two sets of parallel fins 124'. The base 122' is adapted to be mounted on a heat generating electronic device (not shown). The base 122' comprises a horizontal section 132 and a vertical section 134. One of the sets of fins 124' is attached on the base 122' in a space generally between the horizontal and vertical sections 132, 134. The other of the sets of fins 124' is attached on an outmost main face of the vertical section 134. Said one of the sets of fins 124' is most pertinent to the present invention, and all references hereinafter to the fins 124' are references to said one of the sets of fins 124'. A plurality of evenly spaced and parallel L-shaped first holes 126' is defined through the horizontal and vertical sections 132, 134. Each first hole 126' spans opposite side extremities of the base 122', and is oriented perpendicular to the fins 124'. A second hole 128' is defined through a middle of the horizontal section 132, in a longitudinal direction that is parallel to the fins 124. The second hole 128' is defined at a lower level than the first holes 126', so that the first and second holes 126', 128' do not communicate with each other.

Figure 8:
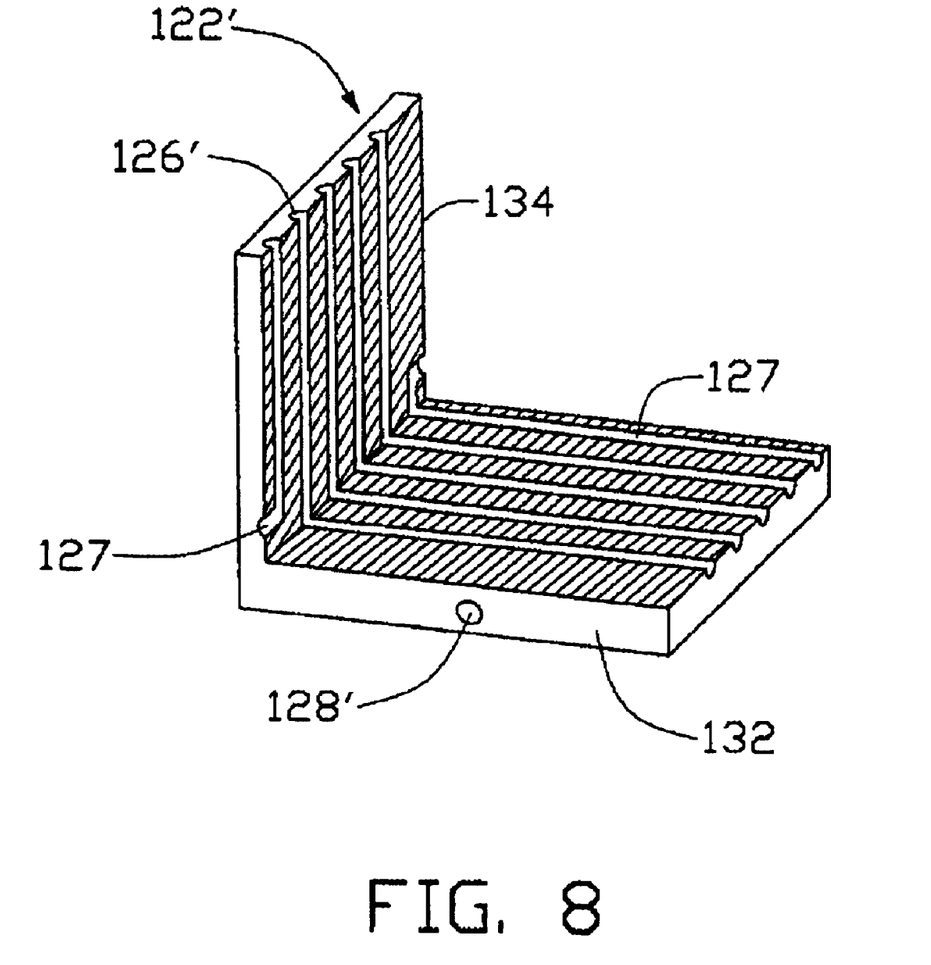
FIG. 8 is a perspective cut-away view of a base of a heat sink of the heat dissipation device of FIG. 5.
Figure 9:
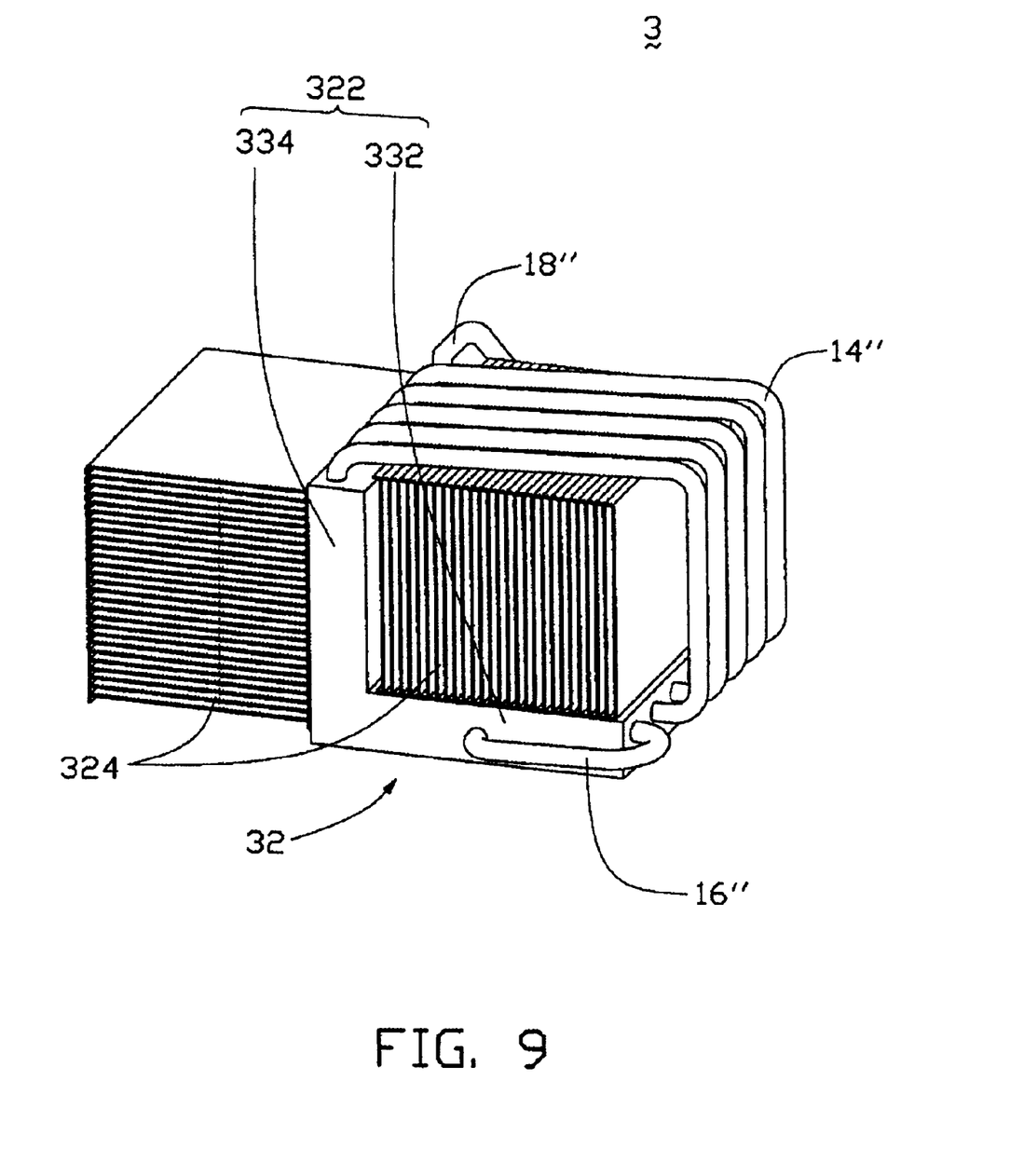
FIG. 9 is a perspective view of a heat dissipation device in accordance with a further alternative embodiment of the present invention.

An L-shaped channel 127 is defined through the horizontal section 132 and part of the vertical section 134, at one side of the first holes 126'. Said channel 127 spans a side extremity of the horizontal section 132 and one end face of the vertical section 134. Another L-shaped channel 127 is defined through the vertical section 134, at an opposite side of the first holes 126'. Said channel 127 spans a top face of the vertical section 134 and an opposite end face of the vertical section 134.

Figure 6:
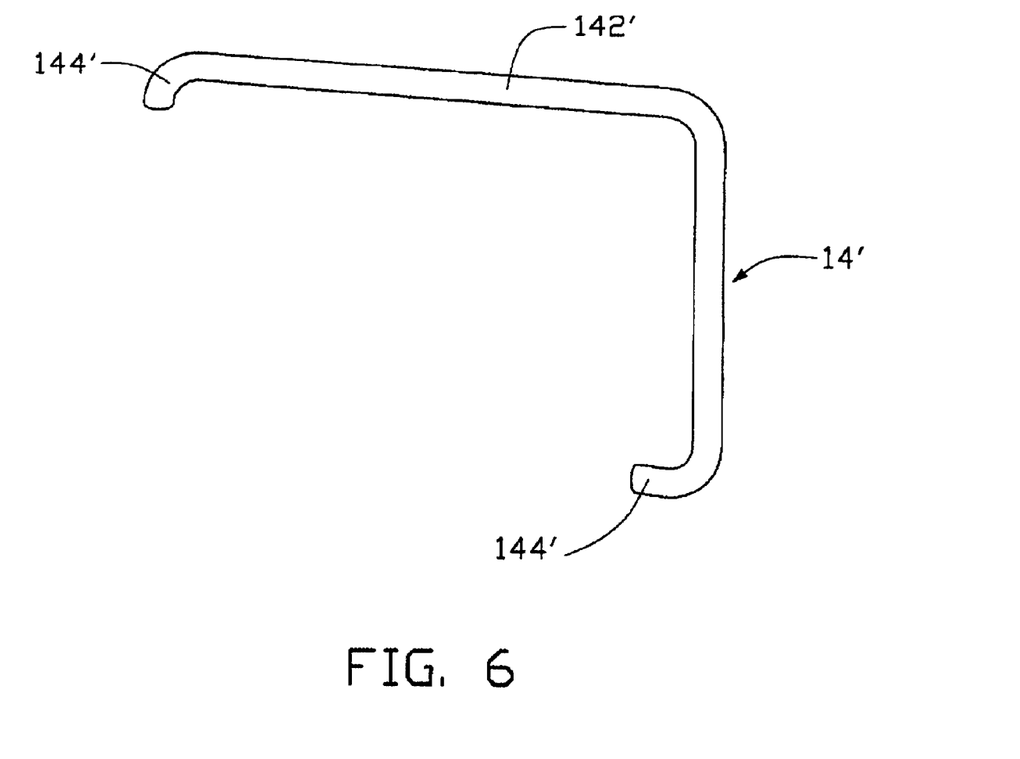
FIG. 6 is a perspective view of a first pipe of the heat dissipation device of FIG. 5.
Figure 7:
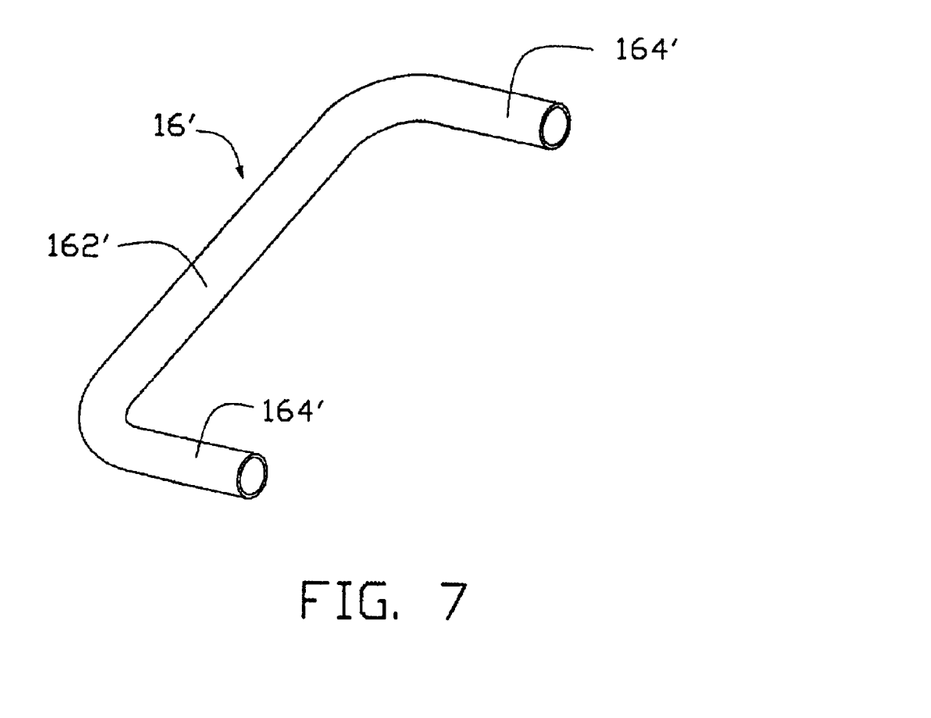
FIG. 7 is a perspective view of a second pipe of the heat dissipation device of FIG. 5, viewed from another aspect.

Referring particularly to FIGS. 6 and 7, the first and second pipes 14', 16' are hollow and have good heat conducting capability. Each first pipe 14' comprises a generally L-shaped main body 142', and a pair of connecting portions 144' bent generally inwardly from opposite free ends of the main body 142' respectively. Each second pipe 16' comprises a generally U-shaped main body 162', and a pair of connecting portions 164' at opposite free ends of the main body 162' respectively.

In assembly, the first and second pipes 14', 16', the first and second holes 126', 128', and the channels 127 are interconnected to form a closed circulatory route. The working liquid is received in the circulatory route. In operation, the base 122' absorbs heat from the heat generating electronic device. The working liquid absorbs some of that heat, and circulates through the circulatory route. Thus the first and second pipes 14', 16' dissipate said heat to airspace beyond the fins 124' of the heat sink 12'. Accordingly, the first and second pipes 14', 16' increase a heat dissipation area of the heat dissipation device 2. The heat removing capability of the heat dissipation device 2 is optimized.

FIGS. 9–13 relate to a heat dissipation device 3 in accordance with a further alternative embodiment of the present invention. The heat dissipation device 3 comprises a heat sink 32, a plurality of first pipes 14", a second pipe 16", a third pipe 18", and working liquid (not shown). The heat sink 32 comprises a base 322 having an L-shaped profile, and two sets of parallel fins 324. The base 322 comprises a horizontal section 332 and a vertical section 334. One of the sets of fins 324 is attached on the base 322 in a space generally between the horizontal and vertical sections 332, 334. The other of the sets of fins 324 is attached on an outmost main face of the vertical section 334. Said one of the sets of fins 324 is most pertinent to the present invention, and all references hereinafter to the fins 324 are references to said one of the sets of fins 324. A plurality of evenly spaced and parallel L-shaped first holes 126" is defined through the horizontal and vertical sections 332, 334. Each first hole 126" spans opposite side extremities of the base 322, and is oriented perpendicular to the fins 324. A second hole 128" is defined through a middle of the horizontal section 332, in a longitudinal direction that is parallel to the fins 324. The second hole 128" is defined at a lower level than the first holes 126", so that the first and second holes 126", 128" do not communicate with each other.

Figure 10:
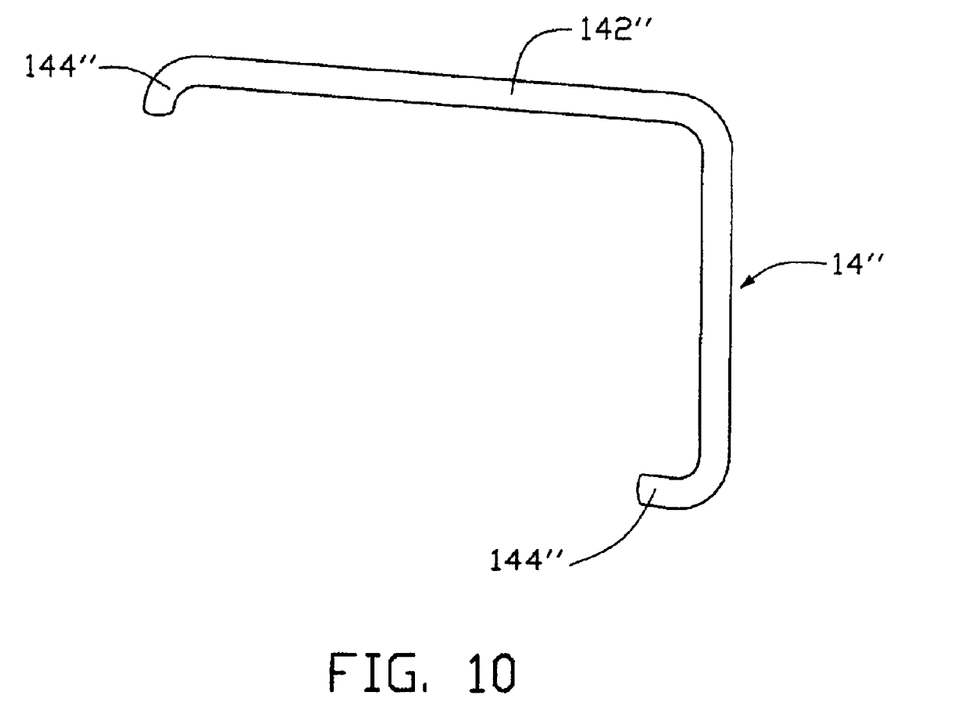
FIG. 10 is a perspective view of a first pipe of the heat dissipation device of FIG. 9.
Figure 11:
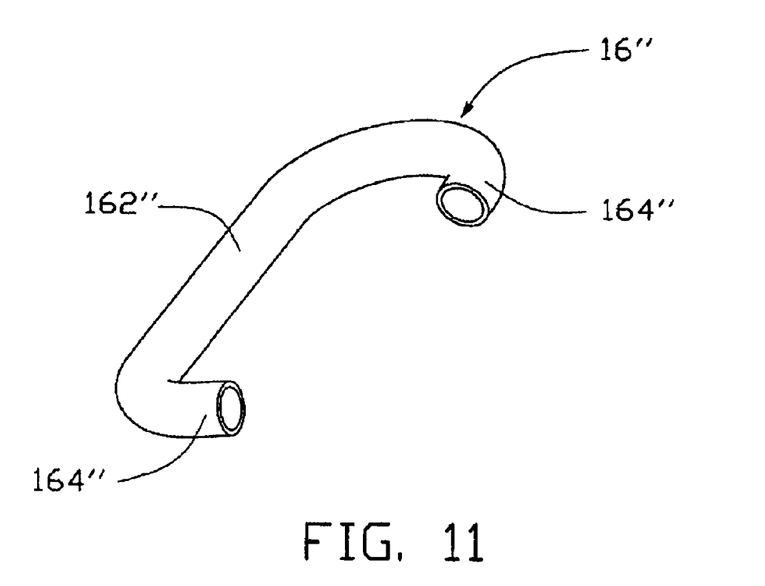
FIG. 11 is a perspective view of a second pipe of the heat dissipation device of FIG. 9, viewed from another aspect.
Figure 12:
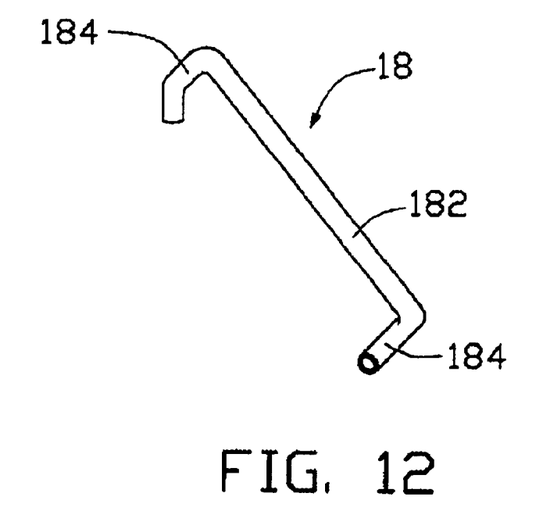
FIG. 12 is a perspective view of a third-pipe of the heat dissipation device of FIG. 9.
Figure 13:
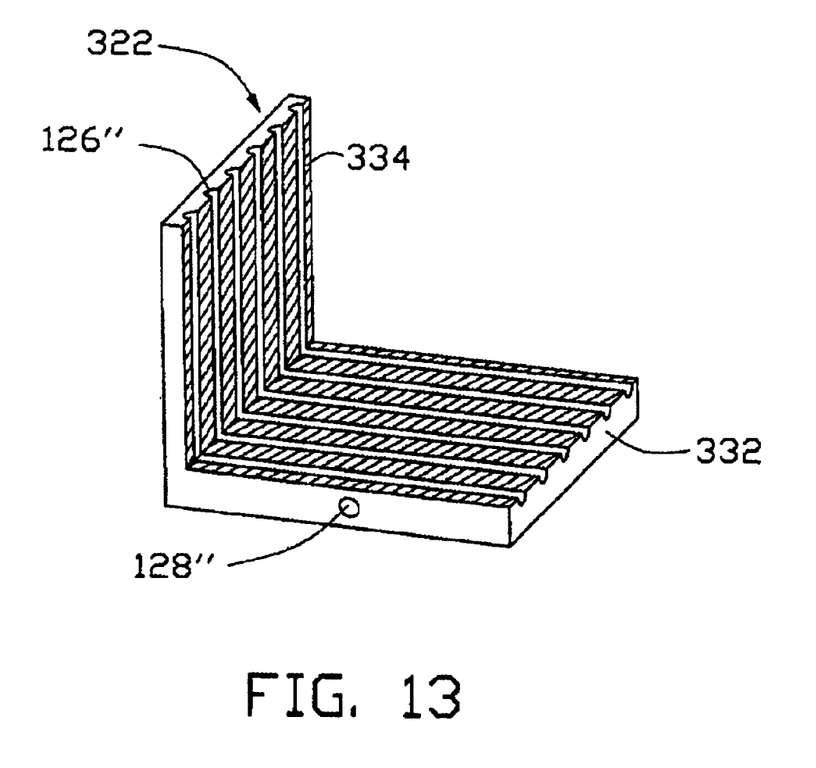
FIG. 13 is a perspective cut-away view of a base of a heat sink of the heat dissipation device of FIG. 9.

Referring particularly to FIGS. 10–12, each first pipe 14" is similar in structure to each first pipe 14 of the preferred embodiment described above. Each second pipe 16" is similar in structure to each second pipe 16' of the alternative embodiment described above. The third pipe 18" is hollow and has good heat conducting capability. The third pipe 18 comprises a main body 182, and a pair of connecting portions 184 extending generally inwardly from opposite free ends of the main body 182 respectively. The connecting portions 184 extend in an asymmetrical fashion so that they can be easily connected into the appropriate first and second holes 126", 128" of the heat sink 32. In particular, one of the connecting portions 184 has a bend for easy connection into the appropriate first hole 126".

In assembly, the first, second and third pipes 14", 16", 18", and the first and second holes 126", 128" are interconnected to form a closed circulatory route. The working liquid is received in the circulatory route. In operation, the base 322 absorbs heat from the heat generating electronic device. The working liquid absorbs some of that heat, and circulates through the circulatory route. Thus the first, second and third pipes 14", 16", 18" dissipate said heat to airspace beyond the fins 324 of the heat sink 32. Accordingly, the first, second and third pipes 14", 16", 18" increase a heat dissipation area of the heat dissipation device 3. The heat removing capability of the heat dissipation device 3 is optimized.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a heat sink comprising a base adapted to be mounted on a heat generating device and a plurality of fins arranged on the base, a plurality of first holes and a second hole being defined in the base;
    a plurality of first pipes connected in the first holes of the base of the heat sink;
    a pair of second pipes each connected in the second hole and a respective one of the first holes of the base of the heat sink, wherein the first and second pipes and the first and second holes cooperatively form a closed circulatory route; and
    working liquid received in the circulatory route.

2. The heat dissipation device as described in claim 1, wherein each of the first pipes comprises a generally U-shaped main body and a pair of connecting portions on opposite free ends of the main body.

3. The heat dissipation device as described in claim 2, wherein the connecting portions are bent inwardly generally toward each other.

4. The heat dissipation device as described in claim 1, wherein each of the second pipes comprises a generally arcuate main body and a pair of connecting portions at opposite free ends of the main body.

5. A heat dissipation device comprising:
    a heat sink comprising a base with a plurality of fins upwardly extending therefrom;
    a closed circulatory route pipe assembly comprising a plurality of continuous loop sections extending respectively through the base, and each of said loop sections surrounding the fins in essentially a vertical plane of said heat dissipation device.

6. The device as described in claim 5, wherein each said fins extend along a first plane and each of said loop sections extend along a second plane across said first plane.

7. The device as described in claim 5, wherein said pipe assembly further includes a portion extending through the base at different levels with regard to said loop sections in the base, and said portion extends across said loop sections in the base.

8. The device as described in claim 5, wherein said loop sections comprises a plurality of holes defined through the base, and a plurality of pipes each having two connecting portions connected to two adjacent holes at opposite sides of the base respectively.

9. A heat dissipation device comprising:
    a heat sink comprising a base adapted to be mounted on a heat generating device and a plurality of fins arranged on the base, a plurality of first holes and a second hole being defined in the base;
    a plurality of first pipes connected in the first holes of the base of the heat sink;
    a pair of second pipes each connected in the second hole and a respective one of the first holes of the base of the heat sink, wherein the first and second pipes and the first and second holes cooperatively farm a closed circulatory route; and
    working liquid received in the circulatory route; wherein
    the first holes are substantially evenly spaced and parallel to each other, and the second hole is defined through a middle of the base of the heat sink in a direction that is generally perpendicular to the first holes.

10. The heat dissipation device as described in claim 9, wherein the second hole is defined at a lower level than the first holes, so that the first and second holes do not communicate with each other.

* * * * *